US008817489B2

(12) United States Patent
Yang

(10) Patent No.: US 8,817,489 B2
(45) Date of Patent: Aug. 26, 2014

(54) STRUCTURE FOR STACKING PRINTED BOARD ASSEMBLIES IN ELECTRONIC DEVICE AND SHIELDING ELECTRONIC COMPONENTS MOUNTED ON THE PRINTED BOARD ASSEMBLIES

(75) Inventor: Hyun Mo Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 210 days.

(21) Appl. No.: 13/419,715

(22) Filed: Mar. 14, 2012

(65) Prior Publication Data

US 2013/0089992 A1    Apr. 11, 2013

(30) Foreign Application Priority Data

Oct. 10, 2011    (KR) ........................ 10-2011-0102893

(51) Int. Cl.
*H05K 9/00*    (2006.01)

(52) U.S. Cl.
USPC .......................................................... 361/816

(58) Field of Classification Search
USPC ............................. 361/816, 818, 800; 439/74
See application file for complete search history.

(56) References Cited

U.S. PATENT DOCUMENTS

| 4,555,151 | A | * | 11/1985 | Neese et al. ..................... 439/82 |
| 5,270,488 | A | * | 12/1993 | Ono et al. ...................... 174/350 |
| 6,051,781 | A | * | 4/2000 | Bianca et al. ................. 174/351 |
| 6,086,424 | A | * | 7/2000 | Chang ........................... 439/630 |
| 6,163,461 | A | * | 12/2000 | Watanabe ..................... 361/760 |
| 6,293,464 | B1 | * | 9/2001 | Smalley, Jr. ................... 235/451 |
| 6,805,586 | B2 | * | 10/2004 | Akama et al. ............ 439/607.07 |
| 7,345,248 | B2 | * | 3/2008 | Vinokor et al. ............... 174/382 |
| 7,501,587 | B2 | * | 3/2009 | English ......................... 174/354 |
| 7,626,127 | B2 | * | 12/2009 | Kakinoki ....................... 174/382 |
| 7,926,166 | B2 | * | 4/2011 | Zuehlsdorf et al. .......... 29/602.1 |
| 8,009,441 | B2 | * | 8/2011 | Clancy et al. ................. 361/816 |
| 2013/0089992 | A1 | * | 4/2013 | Yang .............................. 439/75 |

* cited by examiner

*Primary Examiner* — Neil Abrams
(74) *Attorney, Agent, or Firm* — Jefferson IP Law, LLP

(57) ABSTRACT

A structure for stacking Printed Board Assemblies (PBAs) in an electronic device is provided. The structure for stacking PBAs in an electronic device includes a clip mounted on a main Printed Circuit Board (PCB), a sub-PCB including a ground portion, a sub-PBA including the sub-PCB, and a clip header mounted on a lower part of the sub-PBA, wherein the clip header is inserted into the clip. Therefore, electronic components mounted on a main PCB can be shielded from outer electromagnetic waves while reducing material costs without using a shield can, and a sub-PBA can be stacked on the main PBA.

10 Claims, 5 Drawing Sheets

STRUCTURE FOR STACKING PRINTED BOARD ASSEMBLIES IN ELECTRONIC DEVICE AND SHIELDING ELECTRONIC COMPONENTS MOUNTED ON THE PRINTED BOARD ASSEMBLIES

PRIORITY

This application claims the benefit under 35 U.S.C. §119 (a) of a Korean patent application filed on Oct. 10, 2011 in the Korean Intellectual Property Office and assigned Serial No. 10-2011-0102893, the entire disclosure of which is hereby incorporated by reference.

BACKGROUND OF THE INVENTION

1. Field of the Invention

The present invention relates to a structure for stacking Printed Board Assemblies (PBAs) in an electronic device. More particularly, the present invention relates to a structure for stacking PBAs in an electronic device that can shield electronic components mounted on a main Printed Circuit Board (PCB) from outer electromagnetic waves while reducing material costs without using a shield can and stack a sub-PBA on a main PBA.

2. Description of the Related Art

Recently, electronic devices, such as a mobile terminal, have decreased in size for the convenience of being carried. In order to achieve various functions, many components have been mounted within the electronic device. Accordingly, a space for mounting the components within the electronic device has been insufficient. Therefore, a structure for stacking a Secure Digital (SD) card socket and a Subscriber Identification Module (SIM) card socket on a shield can of a main PBA has been widely used.

FIG. 1 is a cross-sectional view illustrating a structure for stacking PBAs in an electronic device according to the related art.

Referring to FIG. 1, a stacked structure 100 includes a main PBA 160, a shield can 130, and a sub-PBA 170. The main PBA 160 includes a main PCB 110, a plurality of electronic components 111 mounted on a top surface of the main PCB 110, and a clip 120 disposed at a periphery of the electronic components 111 and mounted on the main PCB 110. In order to prevent outer electromagnetic waves from causing an erroneous operation of the electronic components 111, the shield can 130 performs a function of shielding outer electromagnetic waves. The shield can 130 includes a wall 130b for shielding a side portion of the electronic components 111 from outer electromagnetic waves and a top plate 130a for shielding an upper part of the electronic components 111 from outer electromagnetic waves. The sub-PBA 170 includes a sub-PCB 140, an SD card socket 190 and an SIM card socket 191 mounted on a top surface of the sub-PCB 140.

The PBA stacked structure 100 addresses the insufficient mounting space by disposing the sub-PCB 140 in which the SD card socket 190 and the SIM card socket 191 are mounted on the top plate 130a of the shield can 130. However, because the shield can 130 is manufactured to include a separate top plate 130a as well as the wall 130b, a need exists for reducing material costs.

Further, a process of stacking the sub-PBA 170 on the main PBA 160 is performed by an operation of mounting the shield can 130 on the clip 120 of the main PCB 110 and then attaching the shield can 130 and the sub-PCB 140 with double-sided tape 150. Therefore, a need exists for reducing manufacturing time of stacking the sub-PBA 170 on the main PBA 160.

SUMMARY OF THE INVENTION

Aspects of the present invention are to address at least the above-mentioned problems and/or disadvantages and to provide at least the advantages described below. Accordingly, an aspect of the present invention is to provide a structure for stacking Printed Board Assemblies (PBAs) in an electronic device with insufficient mounting space that reduces material costs.

Another aspect of the present invention is to provide a structure for stacking PBAs in an electronic device that reduces manufacturing time of a process of stacking a sub-PBA on a main PBA.

In accordance with an aspect of the present invention, a structure for stacking PBAs in an electronic device is provided. The structure includes a clip mounted on a main Printed Circuit Board (PCB), a sub-PCB comprising a ground portion, a sub-PBA comprising the sub-PCB, and a clip header mounted on a lower part of the sub-PBA, wherein the clip header is inserted into the clip.

In accordance with another aspect of the present invention, a structure for stacking PBAs in an electronic device is provided. The structure includes a main PBA comprising a clip mounted on a main PCB, a sub-PCB comprising a ground portion connected to a clip header, and a sub-PBA comprising the sub-PCB, wherein the clip header is mounted on a lower part of the sub-PBA and inserted into the clip.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
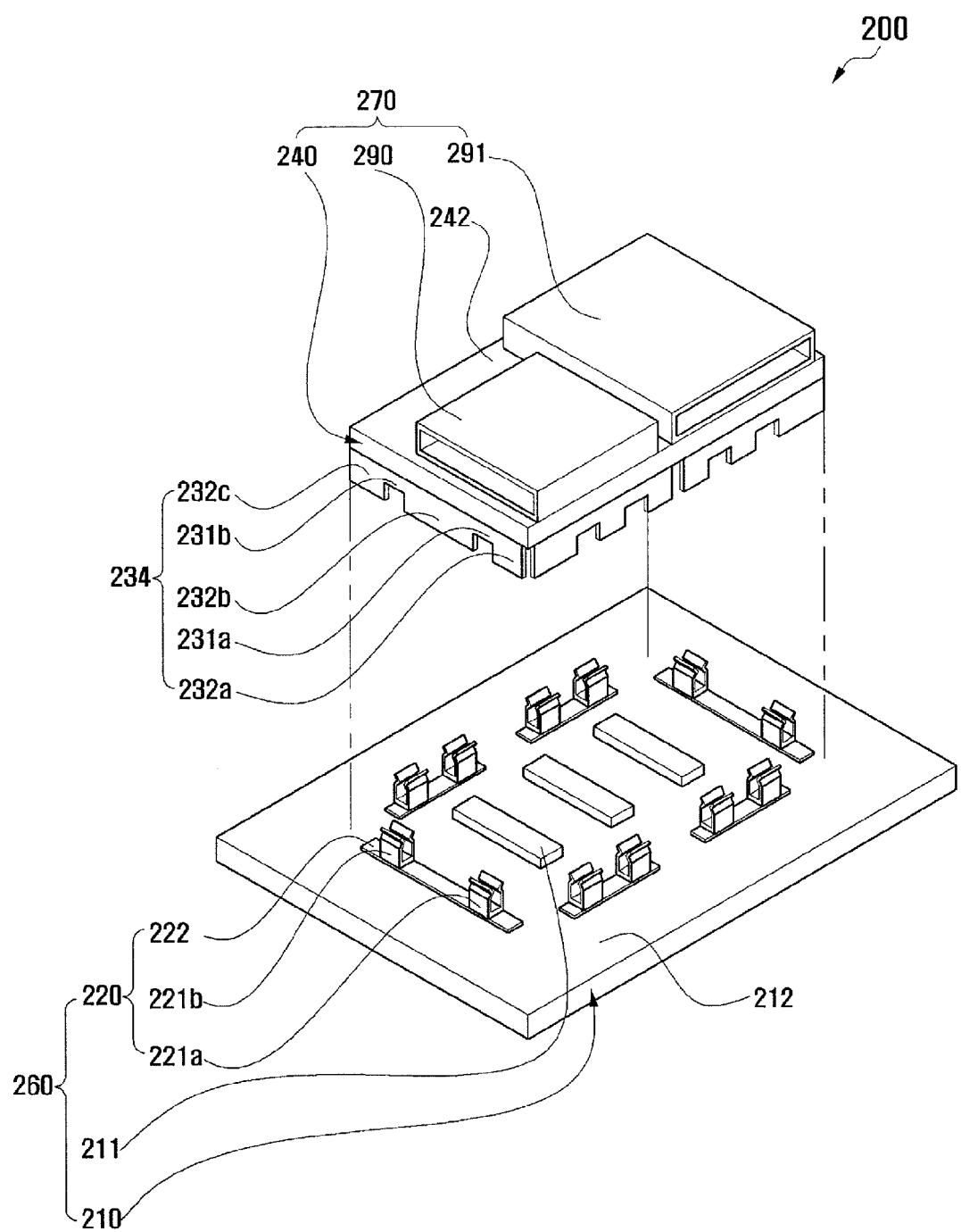
FIG. 2 is an exploded perspective view illustrating a structure for stacking PBAs in an electronic device according to an exemplary embodiment of the present invention.
Figure 3:
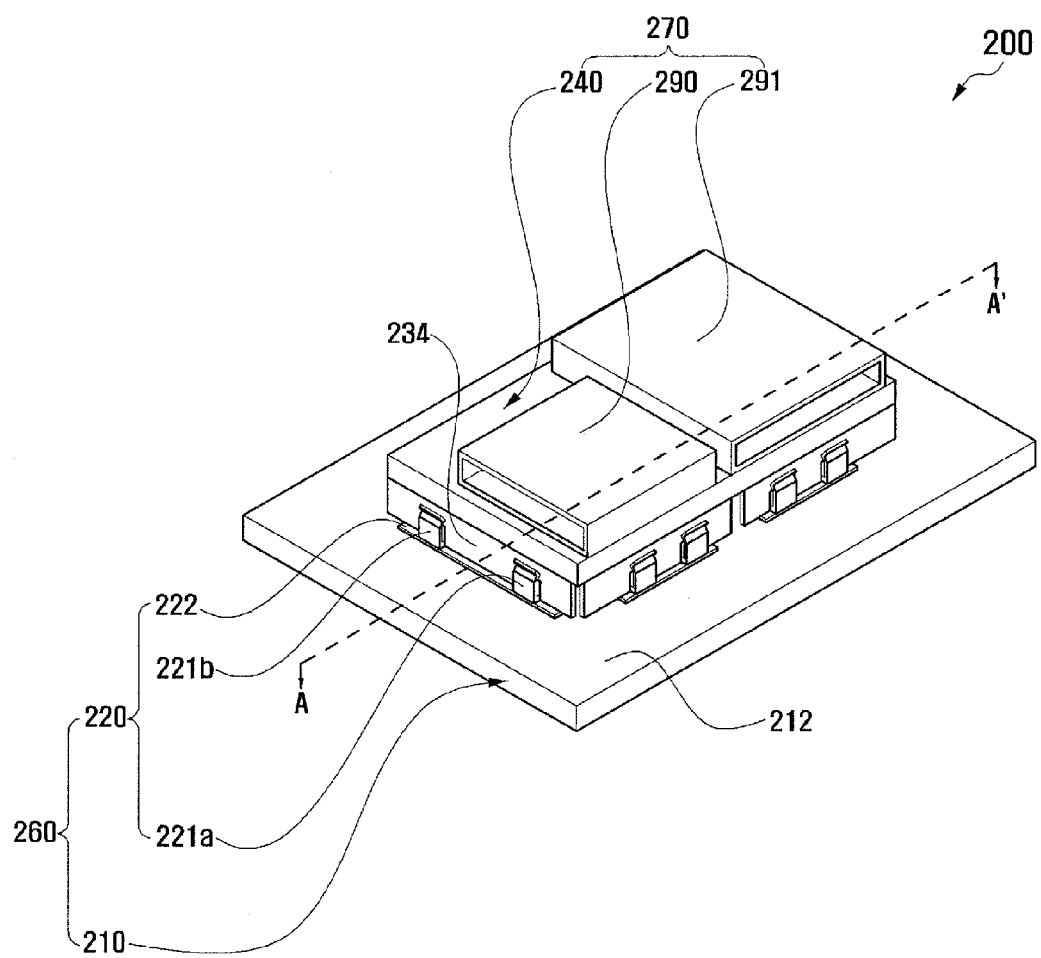
FIG. 3 is a perspective view illustrating a structure for stacking PBAs in an electronic device in which a clip header is inserted into a clip mounted on a main PCB according to an exemplary embodiment of the present invention.
Figure 4:
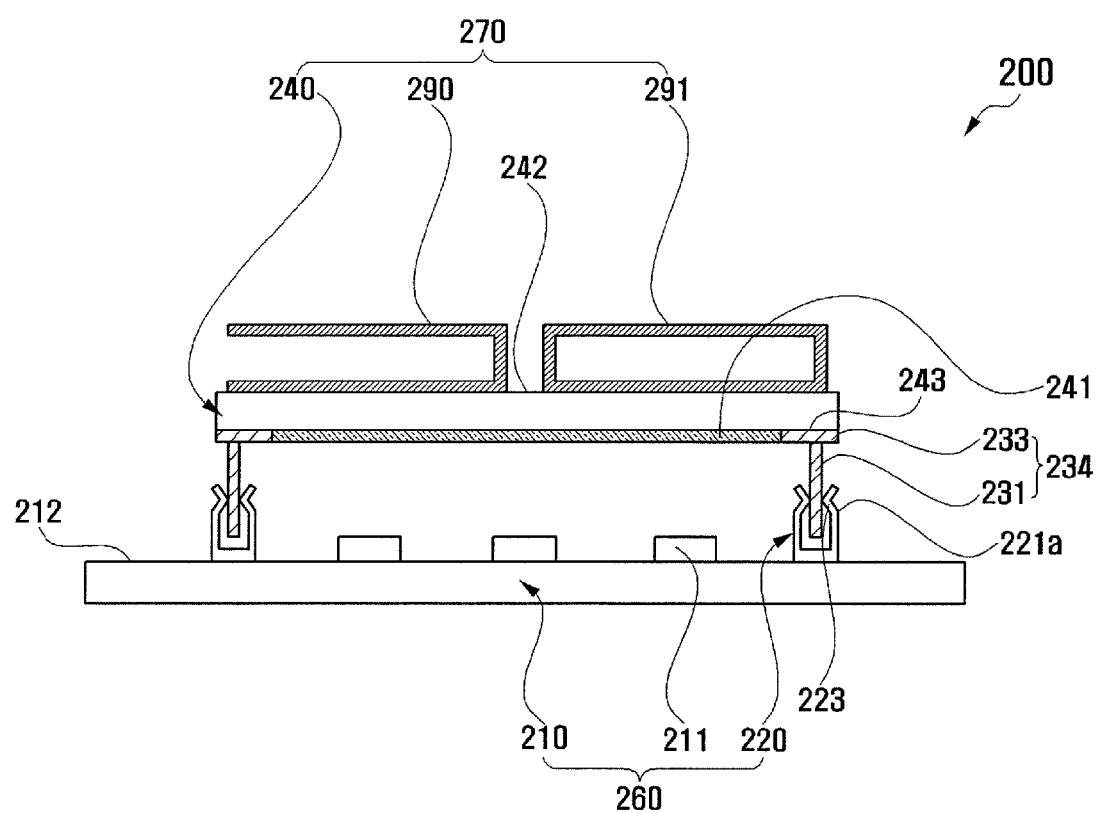
FIG. 4 is a cross-sectional view illustrating a structure for stacking PBAs in an electronic device taken along line A-A' of FIG. 3 according to an exemplary embodiment of the present invention.
Figure 5:
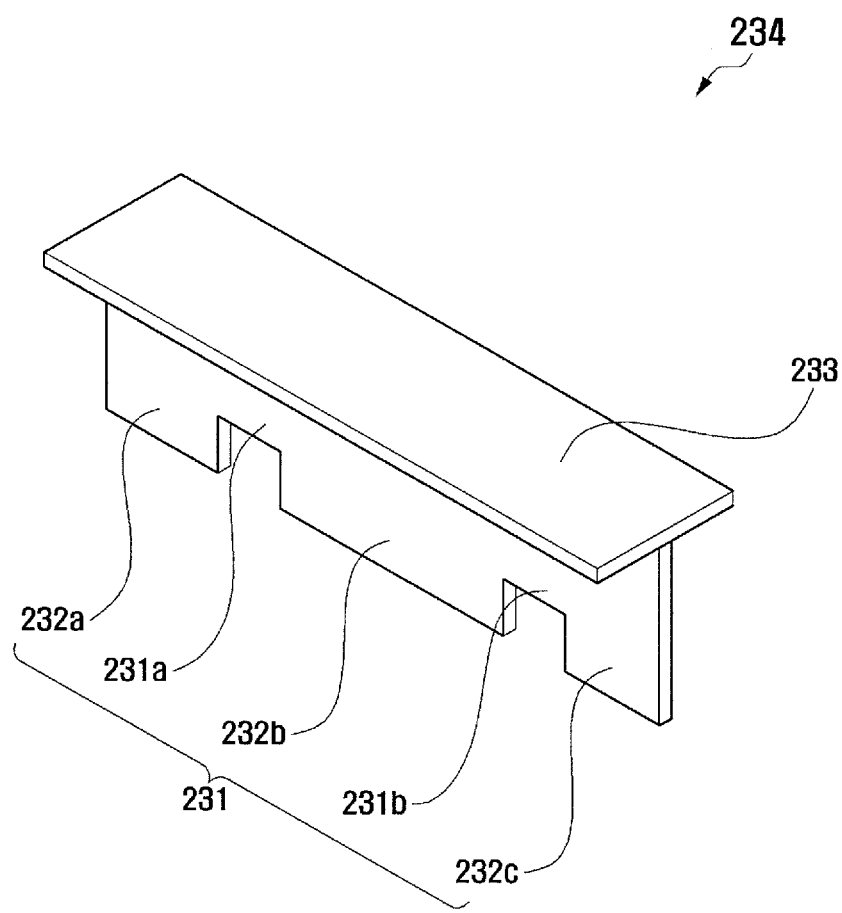
FIG. 5 is a perspective view illustrating a clip header according to an exemplary embodiment of the present invention.

FIG. 2 is an exploded perspective view illustrating a structure for stacking Printed Board Assemblies (PBAs) in an electronic device according to an exemplary embodiment of the present invention, FIG. 3 is a perspective view illustrating a structure for stacking PBAs in an electronic device in which a clip header is inserted into a clip mounted on a main PCB according to an exemplary embodiment of the present invention, FIG. 4 is a cross-sectional view illustrating a structure for stacking PBAs in an electronic device taken along line A-A' of FIG. 3 according to an exemplary embodiment of the present invention, and FIG. 5 is a perspective view illustrating a clip header according to an exemplary embodiment of the present invention. For reference, an electronic device (not illustrated) according to exemplary embodiments of the present invention indicates an electronic product that can be used while being carried, such as a mobile terminal.

Referring to FIGS. 2 to 5, a PBA stacked structure 200 of an electronic device according to an exemplary embodiment of the present invention is described. The PBA stacked structure 200 includes a main PBA 260, a sub-PBA 270, and a clip header 234.

The main PBA 260 includes a main PCB 210, at least one electronic component 211, and a clip 220. The main PCB 210 is a PCB in which a Central Processing Unit (CPU) of an electronic device (not illustrated) is mounted. The electronic component 211 is mounted on a top surface 212 of the main PCB 210, as illustrated in FIG. 2 and may be an Integrated Circuit (IC). Herein, the electronic device includes three electronic components 211, as illustrated in FIG. 2, but is not limited thereto. For example, the electronic device may include one or more electronic components.

In order to fix the clip header 234 to the main PCB 210, the clip 220 is disposed at a periphery of the electronic components 211 and is mounted on the top surface 212 of the main PCB 210. Further, the clip 220 is made of metal and is connected to a ground portion (not illustrated) of the main PCB 210 and thus has a function of shielding a side portion of the electronic component 211 mounted on the main PCB 210 from outer electromagnetic waves. The clip 220 includes a first clip portion 221a and second clip portion 221b having insertion space for inserting the clip header 234 therein and a mounting portion 222. As illustrated in FIG. 4, the first clip portion 221a performs a function of fixing the clip header 234 by an elastic restoring force of a protruded portion 223 that protrudes toward an insertion space into which the clip header 234 is inserted. The second clip portion 221b performs a function of fixing the clip header 234 with the same method. In an exemplary implementation, the clip 220 includes two clip portions 221a and 221b, but is not limited thereto. For example, the clip 220 may include one or more clip portions. The mounting portion 222 performs a function of mounting the first clip portion 221a and the second clip portion 221b on the main PCB 210. The mounting portion 222 is extended in a length-wise direction of the first clip portion 221a and the second clip portion 221b and is integrally formed at a lower surface of the first clip portion 221a and the second clip portion 221b. The mounting portion 222 and the main PCB 210 are coupled to each other by soldering (not illustrated).

The sub-PBA 270 includes a sub-PCB 240 and at least one component 290 and 291. The sub-PCB 240 is stacked at an upper part of the main PCB 210. The sub-PCB 240 includes a ground portion 241 for shielding an upper part of the electronic component 211 mounted on the main PCB 210 from outer electromagnetic waves. In an exemplary implementation, the ground portion 241 forms a lowermost layer of the sub-PCB 240, but may form an inner layer of the sub-PCB 240. The ground portion 241 may be connected to the clip header 234, as illustrated in FIG. 4. The components 290 and 291 are mounted on a top surface 242 of the sub-PCB 240. In an exemplary implementation, the first component 290 is a Secure Digital (SD) card socket, and the second component 291 is a Subscriber Identification Module (SIM) card socket, but is not limited thereto. Other types of components may be used as the first component 290 and the second component 291.

The clip header 234 is mounted on a lower part of the sub-PBA 270 and is inserted into the clip 220 of the main PBA 260. The clip header 234 performs a function of stacking the sub-PBA 270 on an upper part of the main PBA 260 by being inserted into the clip 220. Further, the clip header 234 is made of metal and thus performs a function of shielding a side portion of the electronic component 211 mounted on the main PCB 210 from outer electromagnetic waves. In an exemplary implementation, the clip header 234 is mounted on a lower surface 243 of the sub-PCB 240 and is connected to the ground portion 241 of the sub-PCB 240. As illustrated in FIGS. 4 and 5, the clip header 234 includes a wall 231 and a mounting portion 233. The wall 231 is protruded toward the main PCB 210. The wall 231 has an insertion portion 231a inserted into the first clip portion 221a of the clip 220 and an insertion portion 231b inserted into the second clip portion 221b of the clip 220. Further, the wall 231 has protruded portions 232a, 232b, and 232c protruded toward the main PCB 210 further than both sides of the insertion portions 231a and 231b. The mounting portion 233 performs a function of mounting the clip header 234 on the sub-PCB 240 and is extended in a length-wise direction of the wall 231. Further, the mounting portion 233 is connected to an upper end portion of the wall 231 while having contact with the edge of the ground portion 241. The mounting portion 233 and the sub-PCB 240 are coupled to each other by soldering (not illustrated).

The PBA stacked structure 200 of the electronic device according to an exemplary embodiment of the present invention can shield a side portion of the electronic component 211 mounted on the main PCB 210 from outer electromagnetic waves by the clip header 234 mounted on the sub-PCB 240. Further, by the ground portion 241 included in the sub-PCB 240, an upper part of the electronic component 211 mounted on the main PCB 210 can be shielded from outer electromagnetic waves. Accordingly, the electronic component 211 mounted on the main PCB 210 can be shielded from outer electromagnetic waves without using the shield can 130 of the PBA stacked structure 100 of the electronic device of the related art illustrated in FIG. 1.

Figure 1:
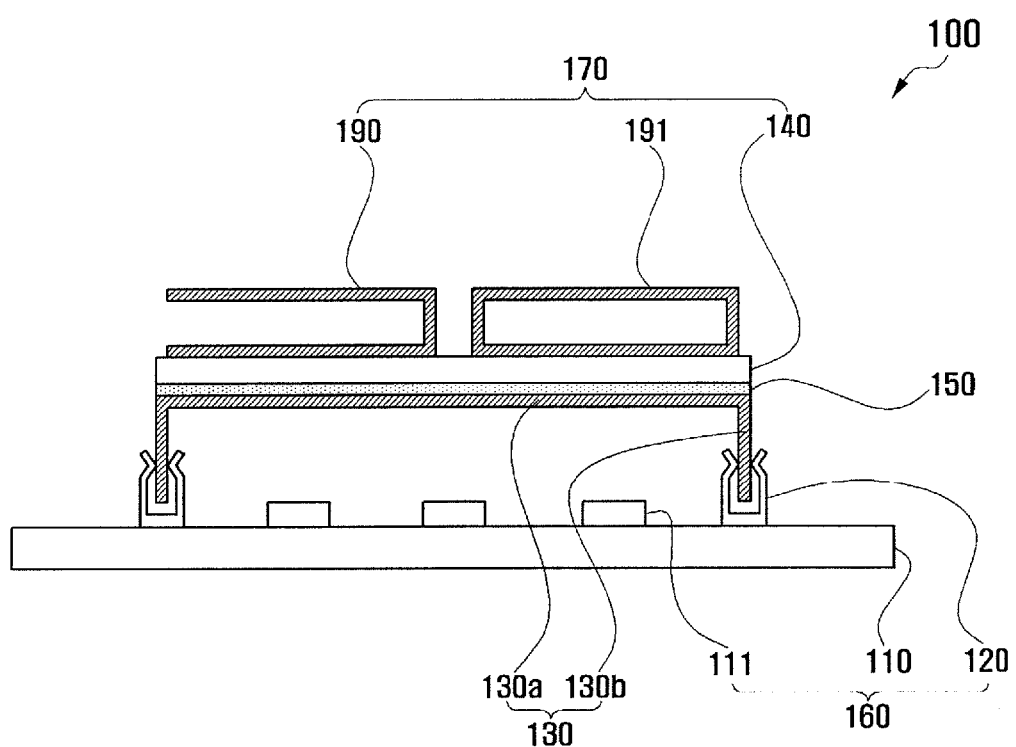
FIG. 1 is a cross-sectional view illustrating a structure for stacking Printed Board Assemblies (PBAs) in an electronic device according to the related art.

Further, the PBA stacked structure 100 illustrated in FIG. 1 additionally requires a material for the shield can 130 including the top plate 130*a* for shielding an upper part of the electronic component 111 from outer electromagnetic waves and the wall 130*b* for shielding a side portion of the electronic component 111 from outer electromagnetic waves in addition to the main PBA 160 and the sub-PBA 170. However, the PBA stacked structure 200 according to an exemplary embodiment of the present invention additionally requires a material for only the clip header 234 for shielding a side portion of the electronic component 211 from outer electromagnetic waves in addition to the main PBA 260 and the sub-PBA 270. Therefore, the stacking of the sub-PBA 270 on an upper part of the main PBA 260 can be implemented while reducing material costs.

Further, as illustrated in FIG. 1 of the related art, in a process of stacking the sub-PBA 170 on the main PBA 160, two operations including an operation of fixing the shield can 130 to the main PBA 160 and an operation of attaching the sub-PBA 170 to the shield can 130 are necessary. However, in an exemplary implementation, a process of stacking the sub-PBA 270 on the main PBA 260 is complete with one operation of inserting the clip header 234 mounted on the sub-PCB 240 into the clip 220 mounted on the main PCB 210. Therefore, manufacturing time can be reduced.

According to an exemplary embodiment of the present invention, a clip header inserted into a clip of a main PCB is mounted on a lower part of a sub-PBA. Further, a sub-PCB of the sub-PBA has a ground portion. Accordingly, material costs can be reduced, a PBA stacked structure can be implemented, and an electronic component mounted on a main PBA can be shielded from outer electromagnetic waves, without stacking a sub-PBA on a main PCB using a shield can according to the related art.

Further, by inserting a clip header mounted on a lower part of a sub-PBA into a clip mounted on a lower part of the main PBA, the sub-PBA can be stacked on the main PBA, and thus manufacturing time for stacking the sub-PBA on the main PBA can be reduced, without stacking using a shield can according to the related art.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A structure for stacking Printed Board Assemblies (PBAs) in an electronic device, the structure comprising:
   a clip mounted on a main Printed Circuit Board (PCB);
   a sub-PCB comprising a ground portion;
   a sub-PBA comprising the sub-PCB and a component mounted on a top surface of the sub-PCB; and
   a clip header directly mounted on a lower part of the sub-PBA and connected to the ground portion of the sub-PCB,
   wherein the clip header is inserted into the clip.

2. The structure of claim 1, further comprising a main PBA comprising the clip.

3. The structure of claim 1, wherein the clip header comprises a structure mounted on the sub-PCB and protruded toward the main PCB.

4. The structure of claim 3, wherein the clip header comprises:
   a mounting portion directly coupled to the sub-PCB and having contact with an edge of the ground portion of the sub-PCB; and
   a wall protruded from the mounting portion and fastened to the clip.

5. The structure of claim 1, wherein the clip comprises a protruded portion connected to a ground portion of the main PCB for forming an insertion space for housing the clip header, and for fixing the clip header with an elastic restoring force.

6. A structure for stacking Printed Board Assemblies (PBAs) in an electronic device, the structure comprising:
   a main PBA comprising a clip mounted on a main Printed Circuit Board (PCB);
   a sub-PCB comprising a ground portion connected to a clip header; and
   a sub-PBA comprising the sub-PCB and a component mounted on a top surface of the sub-PCB,
   wherein the clip header is directly mounted on a lower part of the sub-PBA and inserted into the clip.

7. The structure of claim 6, wherein the clip header comprises a structure mounted on the sub-PCB and protruded toward the main PCB.

8. The structure of claim 7, wherein the clip header comprises:
   a mounting portion directly coupled to the sub-PCB and having contact with an edge of the ground portion of the sub-PCB; and
   a wall protruded from the mounting portion and fastened to the clip.

9. The structure of claim 8, wherein the clip comprises metal.

10. The structure of claim 6, wherein the clip comprises a protruded portion connected to a ground portion of the main PCB for forming an insertion space for housing the clip header, and for fixing the clip header with an elastic restoring force.

* * * * *